United States Patent [19]

Kushida

[11] Patent Number: 5,905,294
[45] Date of Patent: May 18, 1999

[54] HIGH RATED VOLTAGE SEMICONDUCTOR DEVICE WITH FLOATING DIFFUSION REGIONS

[75] Inventor: Tomoyoshi Kushida, Seto, Japan

[73] Assignee: Toyota Jidosha Kabushihi Kaisha, Toyota, Japan

[21] Appl. No.: 08/787,682

[22] Filed: Jan. 23, 1997

[30] Foreign Application Priority Data

Jan. 24, 1996 [JP] Japan .................................. 8-010388

[51] Int. Cl.⁶ .................................................. H01L 29/78
[52] U.S. Cl. .......................................... 257/409; 257/339
[58] Field of Search .................................. 257/168, 339, 257/340, 409

[56] References Cited

U.S. PATENT DOCUMENTS

| 5,345,101 | 9/1994 | Tu | 257/495 |
| 5,557,127 | 9/1996 | Ajit et al. | 257/339 |

FOREIGN PATENT DOCUMENTS

| 60-262468 | 12/1985 | Japan . | |
| 3-155167 | 7/1991 | Japan | 257/339 |

*Primary Examiner*—David B. Hardy
*Attorney, Agent, or Firm*—Pillsbury Madison & Sutro LLP

[57] ABSTRACT

A field-effect semiconductor device has a gate pad at the outside of an area of a semiconductor element and island regions of a conductivity type opposite that of a substrate of the device at surfaces of the device under the gate pad. When voltage is applied to the semiconductor device's drain, depletion layers form and extend to the opposite side of the substrate from each of the island regions and become continuous with one another. Thus, the voltage applied to the device's insulation layers is limited and a high rated voltage of the device can be obtained. Further, this arrangement provides a wide contact area between the gate pad and the gate wiring because meshed gate wiring is formed in the area between the island regions. In this way, insulation film having no contact holes in the island regions and contact holes in the body region may be formed without replacing masks by alternating the opening with for introducing impurities in the island region and the opening width in the body region.

19 Claims, 9 Drawing Sheets

HIGH RATED VOLTAGE SEMICONDUCTOR DEVICE WITH FLOATING DIFFUSION REGIONS

BACKGROUND OF THE INVENTION

1. Field of the Invention

This invention relates to techniques for increasing rated voltage of field-effect semiconductor devices.

2. Description of the Prior Art

In the case of field-effect semiconductor devices, both a source region and a body region are formed adjacent to each other at one surface of a semiconductor substrate thereof, and a drift region is accordingly formed at the other surface of the substrate. In this specification, the surface where both the source region and the body region are formed will be defined as a top surface, and the other surface where the drift region is formed will be defined as a bottom surface.

In the case of controlling a large quantity of electric power by this semiconductor device, a plurality of units are formed at the top surface of the semiconductor substrate where each unit is defined by a structure formed by one source region and one body region adjacent to each other. FIG. 13 shows an example in the case that the plurality of source regions S and the plurality of body regions G are arranged alternately and in parallel with each other at the top surface of the substrate ST.

In the case of such a semiconductor device, it is necessary to connect externally the source regions S. For this reason, a single source pad is required for connecting a lead wire from outside to the semiconductor device. The single source pad is connected to all of the source regions S. It is necessary to lessen each distance between the source pad and each source region S so as to lower the resistance between the source and the drain in the semiconductor device. It is also necessary for the source pad to have a certain spreading thereof so as to connect it to the lead wire. For these reasons, the source pad is formed in an area for covering the overall source regions S. In FIG. 14, SP shows an example of the source pad.

There is a necessity of gate electrodes for facing each body region G. An insulation film is needed between the gate electrodes and the body regions. An example of the gate electrodes is illustrated by GE in FIG. 14. It is necessary for these gate electrodes GE to be insulated from the source pad SP and to be connected externally. For this reason, the gate pad is necessary. As described above, the source pad SP covers an area Z (which will be designated as an element area thereafter) where the source regions S and the drain regions G are arranged adjacent to each other. After all, there is no way but the gate pad GP is provided in other areas than the element area Z. FIG. 14 illustrates an example of the gate pad GP provided in other areas than the element area Z. A gate wiring GS is used for connecting the gate pad GP to the gate electrodes GE. It is also preferable that the resistance between the gate pad GP and the gate wiring GE is low. In the case of FIG. 14, the resistance between the gate pad GP and the gate wiring GS is reduced by contacting the gate pad GP with the gate wiring GS over a broad range of areas thereof. FIG. 10 shows a cross-sectional view taken substantially along line X—X of FIG. 14. Both of these drawings are not, however, consistent with each other since FIG. 14 is just a sort of model. As shown in FIG. 10, the source region S and the body regions G1 and G2 are formed at the top surface STa of the substrate ST. The drain region D is formed at the bottom surface STb of the substrate ST. The source region S, the drain region D and the substrate ST have the same conductivity type, and the body regions G1 and G2 have opposite conductivity type. The source pad SP is formed on a top surface of the source region S, and the source pad SP and the source region S are connected directly. An insulation film 300 is formed to cover the top surface STa at the area other than the element area Z, and the gate wiring GS is formed on a top surface 300a of the insulation film 300. The insulation film 300 is not formed above the body region G1, and the gate electrode GE is connected to the gate wiring GS. The gate electrode GE faces the body region G1 but is insulated from the body region G1 by an insulation film 304. The gate pad GP is formed on a top surface of the gate wiring GS. The source pad SP and the gate electrode GE are insulated by an insulation layer 302. A drain electrode DE is formed on the bottom surface STb of the substrate ST.

According to this structure, the gate pad GP contacts with the gate wiring GS over a broad range of areas in the area other than the element area Z to reduce the resistance between the gate pad GP and the gate electrode GE.

In the case of such a structure, high voltages are, however, often applied to the field insulation film 300 under the gate pad GP when the semiconductor device is off. Accordingly, the field insulation film 300 has to be sufficiently increased in thickness so as to secure a high rated voltage. There is, however, the disadvantage in that the characteristics of the field-effect semiconductor device become unstable by the influence of the resulting stress in the insulating film 300 in the case of increasing the thickness of the insulation film 300. In addition, there is the disadvantage that the thick insulation film 300 is formed in the area other than the element area Z and the thin insulation film 304 is formed in the element area Z. This makes the production process complicated.

Japanese Laid-Open Patent Publication No. 60-262468 discloses a technique for securing high rated voltage without increasing the thickness of the field insulation film. FIG. 11 shows the technique disclosed in the Japanese publication. Parts that are the same as those in FIG. 10 are given like reference symbols and their description will not be repeated. As shown in FIG. 11, in a MOS field-effect transistor having a double diffused structure, this technique forms an electrically floating diffusion region 402 of the same conductivity type with that of the body region G at the top surface of the substrate between the body regions G spaced from each other. This diffusion region 402 is formed in the form of a surface widening over almost all regions of the area formed between the plurality of body regions G.

In the case that the diffusion layer 402 of the opposite conductivity type to that of the semiconductor substrate is formed at the top surface of the semiconductor substrate, a depletion layer 404 spreading on the side of the semiconductor substrate from the diffusion layer 402 is formed when a high voltage is applied to the drain region D. This depletion layer 404 connects to a depletion layer 408 from the body region G, and alleviates an electric field at the semiconductor substrate top surface to secure high rated voltage.

However, when the above-mentioned diffusion region 402 is formed in the form of the surface widening so as to range over almost all the regions of the area formed between the plurality of body regions G, the gate wiring GS cannot be formed above the diffusion region 402 in order to maintain the diffusion region 402 in the electrically floating state, resulting in reducing the contact area between the gate pad and the gate wiring.

As shown in FIG. 12, for forming an insulation film 502 having no contact holes to an electrically floating diffusion region 500 and having contact holes 506 to the other region G, for example, a photolithography process is also required for individually preparing the contact holes 506 apart from the photolithography process required for forming the region G and the region 500.

SUMMARY OF THE INVENTION

An object of the invention is to provide a field-effect semiconductor device which can secure high rated voltage thereof without increasing the thickness of a field insulation film, ensure a broad contact area between a gate pad and a gate wiring, and reduce a resistance between the gate pad and the gate electrode.

Another object of the invention is to provide a method for forming an insulation film having no contact holes to one region (e.g., region 500) and having contact holes to the other region (region G) by using a mask required for forming island regions (G and 500 in FIG. 12) distributed and arranged at the top surface of a semiconductor substrate. This method of the invention makes it possible to form the island regions and an insulation film locally provided with contact holes by one mask.

A field-effect semiconductor device of the invention comprises a source region formed at a top surface of a semiconductor substrate, a body region formed at a position adjacent to the source region, a drain region formed at a bottom surface of the semiconductor substrate, an insulation film for covering the top surface of the semiconductor substrate, a gate electrode facing the body region through the insulation film, and a gate pad which is conductive to the gate electrode, the gate pad being formed above a top surface of the insulation film at the outside of an area where the source region and the body region are arranged adjacent to each other. The semiconductor device according to one aspect of this invention has further a plurality of island regions formed at the top surface side of the semiconductor substrate at the outside of the area where the source region and the body region are arranged adjacent to each other, and having the opposite conductivity type to that of the semiconductor substrate. The plurality of island regions are distributed and arranged spaced apart from each other.

When the island regions are distributed and arranged at the top surface of the semiconductor substrate, a depletion layer extends from each of the island regions to the semiconductor substrate side and a field concentration is alleviated at the semiconductor substrate top surface by this depletion layer, resulting in increasing rated voltage of the field-effect semiconductor device. In this device, since the region for generating a depletion layer is not in the form of surface widening but a plurality of island regions are distributed, there is a space between the island regions. Therefore, it is possible to arrange a conductive layer in the space while the island regions are kept in the electrically floating state.

This semiconductor device can be manufactured by a method having the following steps. Specifically, the method comprises a step of forming an impurity introducing mask having a plurality of openings for forming the body region and the plurality of island regions at the semiconductor substrate top surface, a step of introducing an impurity of the opposite conductivity type to that of the semiconductor substrate to the top surface of the semiconductor substrate through the plurality of openings in the mask and forming the body region and the plurality of island regions, a step of forming an insulation film on a top surface of the mask, and a step of applying an anisotropic etching to the insulation film and forming contact holes. At this place, in the case of forming the impurity introducing mask, the openings are formed in width exceeding two times of the insulation film thickness for the body region and also formed in width not exceeding two times of the insulation film thickness for the plurality of island regions.

According to this method, the body and island regions are formed by introducing the impurity of the opposite conductive type to that of the semiconductor substrate to the top surface of the semiconductor substrate through the plurality of openings formed in the impurity introducing mask. After this step, the insulation film is formed on the top surface of the impurity introducing mask. This insulation film is formed substantially in a constant film thickness along the top surface of the impurity introducing mask, including the openings of the impurity introducing mask. For this reason, the insulation film is formed from both side surfaces of the opening and the opening having a width not exceeding two times of the film thickness is embedded in with the insulation film. On the other hand, a concavity is still left on the surface of the insulation film in the opening having a width exceeding two times of the film thickness, since the insulation film extending from both side surfaces of the opening is not formed continuously even though the insulation film is formed from both side surfaces of the opening. By applying the anisotropic etching to the insulation film in this condition, at the opening having the width exceeding two times of the film thickness, a contact hole is formed through the concavity of the insulation film. However, no opening passing through the insulation film is formed at the opening having the width not exceeding two times of the film thickness where the concavity is not formed at the top surface of the insulation film. In this way, an insulation film is formed which has the contact holes to the body region and which has no contact holes to the island regions, by using the impurity introducing mask for forming the body region and the plurality of island regions.

The present invention will be more fully understood from the following detailed description and appended claims when taken with the accompanying drawings.

DETAILED DESCRIPTION OF THE PREFERRED EMBODIMENTS

Preferred embodiments of the invention will now be described with reference to the drawings.
(First Preferred Embodiment)

Figure 1:
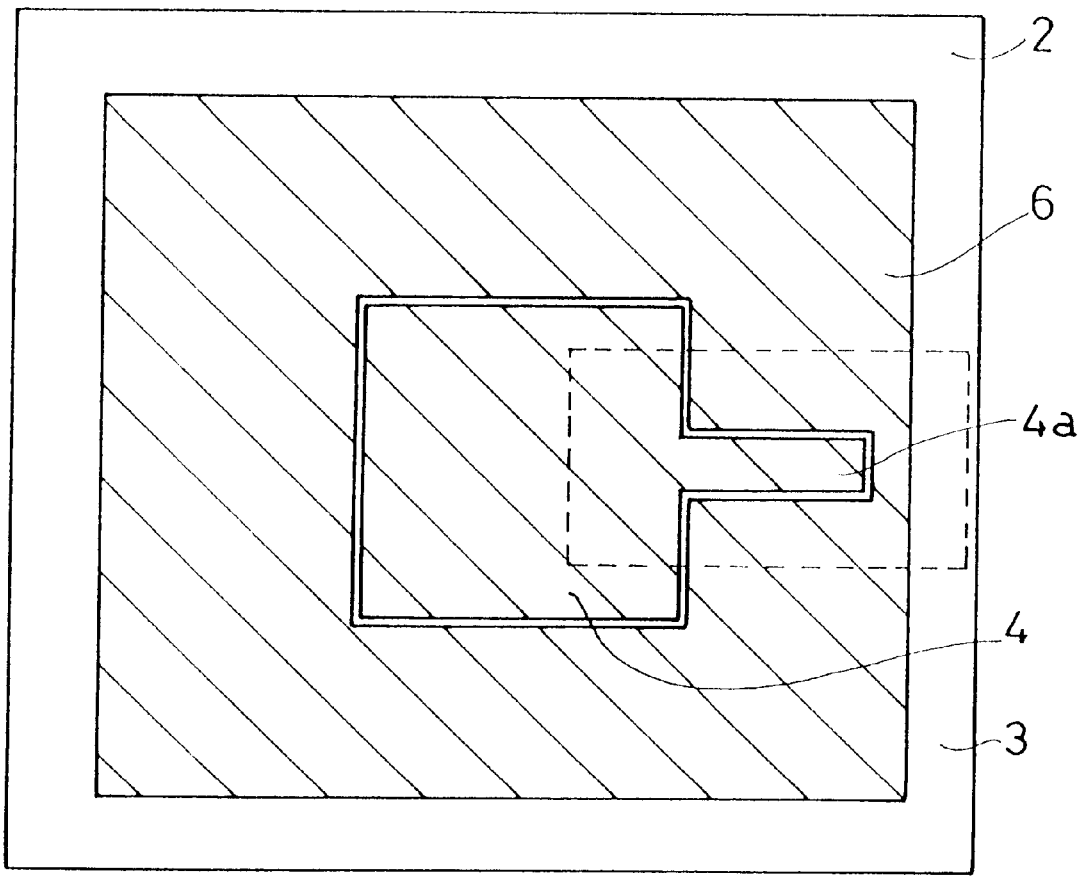
FIG. 1 is a schematic view showing a surface pattern of a chip for integrating a double diffused MOS-FET as a first preferred embodiment of the invention.
Figure 3:
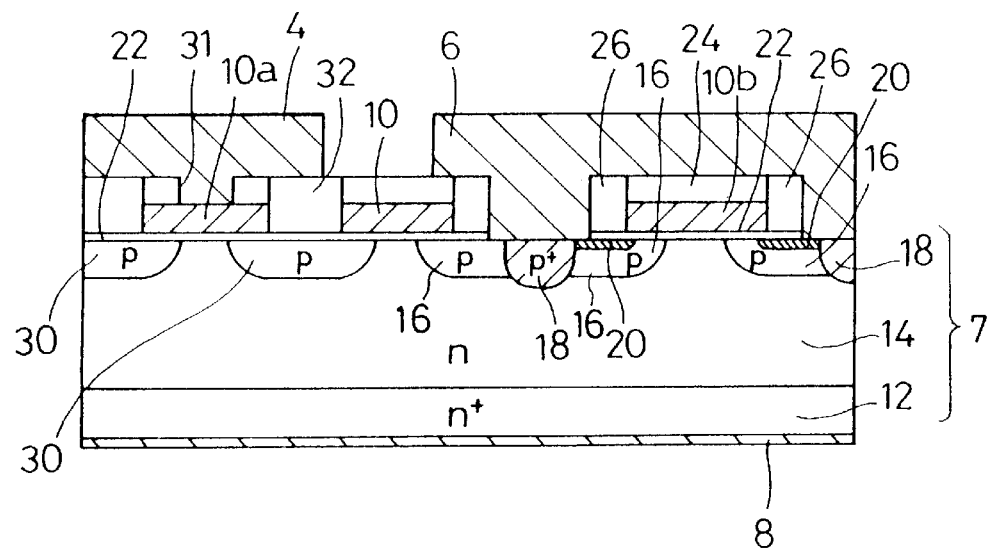
FIG. 3 is a cross-sectional view taken substantially along line III—III in FIG. 2.
Figure 4:
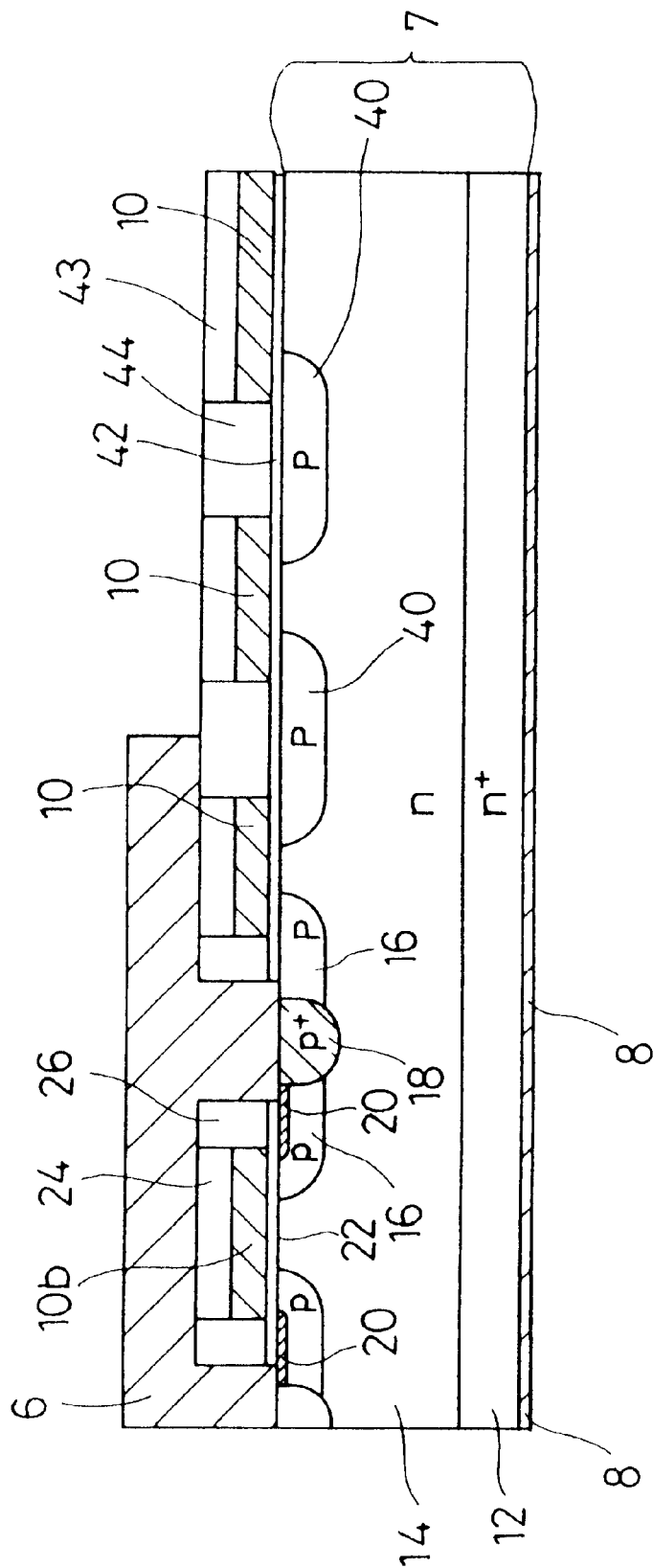
FIG. 4 is a cross-sectional view taken substantially along line IV—IV in FIG. 2.

FIG. 1 shows a pad pattern of a chip 2 for integrating a double diffused MOS (DMOS: Double-Diffused Metal Oxide Semiconductor)-FET (Field Effect Transistor) which is one type of field-effect semiconductor device, FIG. 2 shows an enlarged planar structure of a gate wiring and gate electrodes under the pads in a part of this chip (indicated by dotted lines in FIG. 1), FIG. 3 shows a cross section taken substantially along line III—III of this chip 2, and FIG. 4 shows a cross section taken along line IV—IV of this chip 2.

As shown in FIG. 1, a gate pad 4 and a source pad 6 made of aluminum are formed on the topmost surface of the chip 2 and a part 4a of the gate pad 4 is entrapped in the side of the source pad 6. As shown in FIGS. 3 and 4, a drain pad 8 is formed on a bottom surface of this chip 2. It is to be noted that in the following embodiments, the gate pad 4 will be defined as an electric conductor formed so as to be able to apply a voltage to gate electrodes within an element area and has a portion where a wire bonding is done.

In this chip 2, the source pad 6 is in the element area and the gate pad 4 is at the outside thereof. It is to be noted that the external side of the source pad 6 is a field limiting region 3 for element separation.

Figure 2:
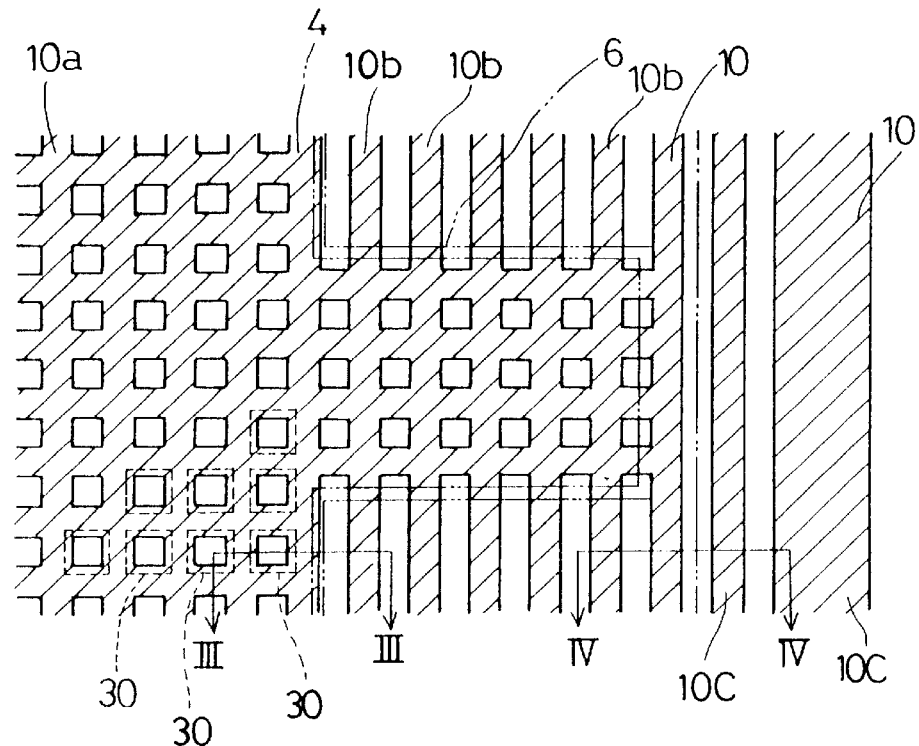
FIG. 2 is a schematic view showing a gate wiring pattern and a gate electrode pattern in an area indicated by dotted lines in FIG. 1.

As shown in FIG. 2, a polycrystalline silicon film 10 doped with phosphorus (P) is formed on the lower side of the gate pad 4 and the source pad 6. Within the area of the source pad 6, that is, the element area, the polycrystalline silicon film 10 is formed in the form of lines in parallel with each other. Gate electrodes are formed by the plurality of line polycrystalline silicon films 10b. These gate electrodes 10b spread within the element area. In the area of the gate pad 4, that is, at the outside of the element area, the polycrystalline silicon film 10 is formed in the form of a mesh. This meshed polycrystalline silicon film 10a is a gate wiring for connecting the gate pad 4 to linear gate electrodes 10b. In this embodiment, the gate electrodes 10b and the gate wiring 10a are formed by a sheet of polycrystalline silicon film 10. The polycrystalline silicon film 10 is also formed in a ring form 10c along the external shape of the chip 2 in the field limiting region 3.

In the present embodiment, the gate wiring 10a and the gate electrodes 10b are formed by the phosphorus-doped polycrystalline silicon film 10, but it may be formed by polycrystalline silicon film and silicide film. In addition, the above-mentioned shapes, such as meshed, linear and ring shapes, are not critical and other shapes are also usable.

As shown in FIGS. 3 and 4, there are formed a drain region 12 composed of a high concentration n$^+$-type semiconductor substrate material, and a low concentration n-type drift region (impurity concentration: $1 \times 10^{18}$ cm$^{-2}$) 14 on the bottom surface side of a semiconductor substrate 7, i.e., on the side of the drain pad 8. At the top surface of the drift region 14, a low concentration p-type body region (impurity concentration: $1 \times 10^{18}$ cm$^{-2}$) 16 is formed in the range of 1 μm in depth within the element area, and a high concentration p$^+$-type body region 18 is formed on the inside of the low concentration body region 16. A high concentration n$^+$-type source region 20 is formed at the topmost surface of the low concentration p-type body region 16. The source region 20 and the body region 16 are adjacent to each other at the top surface of the semiconductor substrate 7. The source region 20 and the body region 16 extend in the vertical direction of the drawing pages in FIGS. 3 and 4 in parallel with each other. A plurality of gate electrodes 10b and a plurality of body regions 16 clamp an insulation film 22 therebetween and face each other in the element area. The source region 20 is also formed between the gate electrodes 10b in parallel with each other.

Each gate electrode 10b described above is formed between a pair of body regions 16. The pair of body regions 16 are insulated from the gate electrode 10b by the insulation film 22. The film thickness of the film 22 is 50 nm. A MOS structure is formed by the gate electrode 10b, the insulation film 22, the body region 16, the source region 20 and the drift region 14. The gate electrode 10b is electrically connected to the gate pad 4 at the outside of the element area through the gate wiring 10a formed in the form of mesh and also electrically insulated from the source pad 6 located above this gate electrode 10b by insulation films 24 and 26. The source pad 6 contacts with both of the high concentration n$^+$-type source region 20 and the high concentration p$^+$-type body region 18.

Multiple p-type diffusion regions 30 are formed spaced apart from each other at a predetermined interval under the gate pad 4. These p-type diffusion regions 30 have the opposite conductivity type to both the source region 20 and the drain region 12, have the same conductivity type as that of the body region 16, and are distributed at an interval (2 μm).

Each of p-type diffusion regions 30 has low concentration. The impurity concentration is $1 \times 10^{18}$ cm$^{-2}$ (same as the body region 16). The p-type diffusion regions 30 are formed in the gate pad area at the same time when the low concentration p-type body regions 16 are formed in the element area. Each island-like diffusion region 30 is formed in a roughly square shape and these island regions 30 are distributed as shown in FIG. 2.

The gate wiring 10a is formed in the form of a mesh so as to avoid the upright portion of the distributed island-like diffusion regions 30. In other words, the gate wiring 10a is formed within the area formed between the plurality of distributed diffusion regions. Since the gate wiring 10a is not formed at the upright portions of the diffusion regions 30, the diffusion regions 30 are kept in an electrically floating state. An insulation film 32 is formed between these meshed gate wirings 10a, that is, at the upright portions of the p-type diffusion regions 30.

The gate pad 4 is further formed on this meshed gate wiring 10a and connected to the gate wiring 10a through a contact hole 31 in the form of a meshed pattern as substantially corresponds to the gap area between the distributed p-type diffusion regions 30. The gate pad 4 and the gate wiring 10a contact with each other over a broad range of areas. On the other hand, the p-type diffusion regions 30 are in an electrically floating state, because the insulation film 32 covers the p-type diffusion regions 30 and the gate wiring 10a is not formed at upright portions of the diffusion regions 30. The gate pad 4 does not give influence to the diffusion regions 30, because the thick insulation film 32 is interposed between the gate pad 4 and the diffusion regions 30.

As shown in FIG. 4, p-type diffusion regions 40 for field separation are formed spaced apart at a predetermined interval with one another as a ring thereof and make a round thereof along the exterior of the chip 2 in the field limiting area 3. Each p-type diffusion region 40 is formed at a space for pinching off from each other at a voltage not more than the proof voltage of insulation films 42 and 43 formed upwards. The polycrystalline silicon film 10 is formed as a ring as if it were sewn between these diffusion regions 40. The insulation film 42 is formed on these diffusion regions 40, and the insulation film 43 is further formed on the polycrystalline silicon film 10. An insulation film 44 is also formed right above the diffusion region 40. In this region, these polycrystalline silicon films 10 and p-type diffusion regions 40 are in an electrically floating state since no electrode pads are formed therein.

Now, a detailed description will be given of the operation of the p-type diffusion regions 30 and 40 in the semiconductor device fabricated in this manner with reference to FIGS. 5 and 6. The gate wiring 10a herein is set at a zero voltage with respect to the source.

Figure 5:
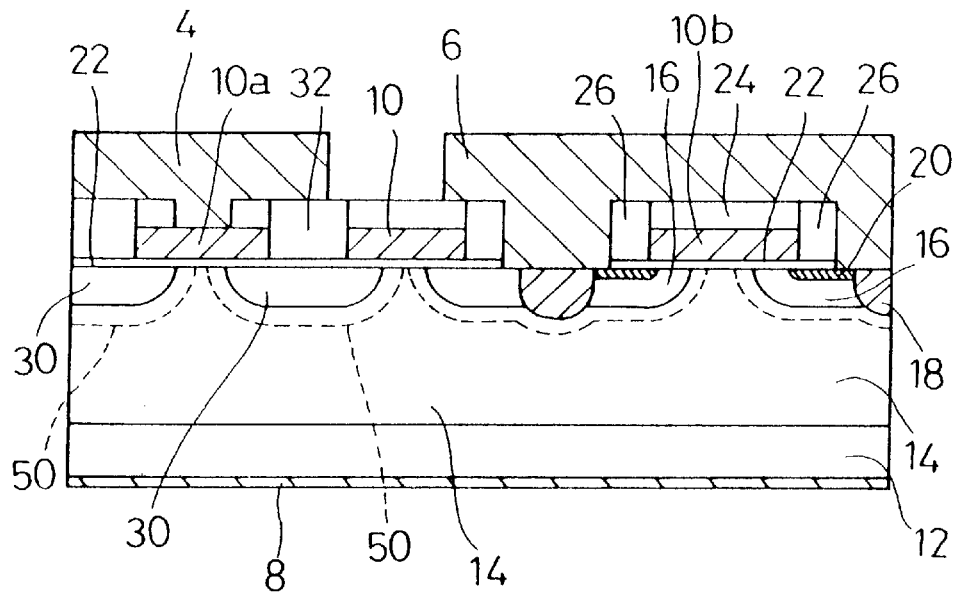
FIG. 5 is a schematic view showing a condition of depletion layers formed by p-type diffusion regions in a gate wiring region.
Figure 6:
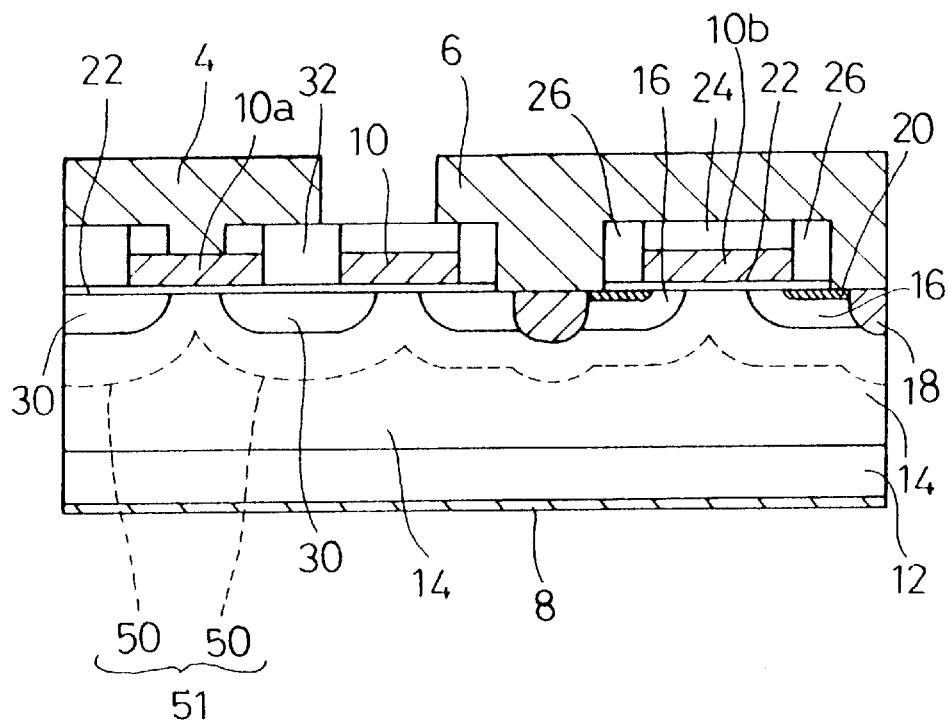
FIG. 6 is a schematic view showing a condition of depletion layers formed by p-type diffusion regions in the gate wiring region.

According to the structure of the present embodiment, a depletion layer 50 extends to the side of the drift region 14 from each p-type diffusion region 30 in the formation range of the gate pad 4 as shown in FIG. 5. This depletion layer 50 is not continuous in a condition that no voltages are applied to the drain pad 8. On the contrary, once a positive voltage is applied to the drain pad 8, the depletion layer 50 spreads to the side of the drift region 14. When a high voltage is applied to the drain pad 8, the depletion layers 50 spread enough to connect to each other and the depletion layers 50 are pinched off, as shown in FIG. 6. The voltage when the depletion layers 50 are pinched off is set to be smaller than the voltage which applies to the insulation film 22 a voltage exceeding the proof voltage of the insulation film 22. If the diffusion regions 30 are not provided, the insulation of the film 22 is broken at the voltage. Therefore, a high rated voltage of the device is secured by these diffusion layers 30, and the thickness of the insulation film 22 can be made thin. In the present embodiment, the drain proof voltage was 950 V.

In this manner, the rated voltage of the semiconductor device can be increased by distributing the island type diffusion regions 30 having the opposite conductivity type to that of the semiconductor substrate without thickening the insulation film 22 within the formation area of the gate pad 4. In the present embodiment, the thickness of the insulation film 22 at the outside of the element area which is a formation area of the gate pad 4 is equal to the thickness of the insulation film 22 at the element area which is a formation area of the source pad 6.

It is possible to form the gate wiring in the form of a mesh and also possible to secure the wide contact area between the gate pad 4 and the gate wiring 10a. Since the island diffusion regions 30 are distributed and the gate wiring 10a is in the form of a mesh, the gate wiring 10a can be formed in the area between the island regions 30. Therefore, the distributed island regions 30 are kept in the electrically floating state. As a result, it is possible to properly reduce the gate resistance, it is possible to secure a quantity of current, and it is possible to keep the island regions 30 in an electrically floating state. Therefore, this is suitable for use in a semiconductor device for a large quantity of current.

Particularly, it is possible to freely design the contact position between the gate pad and the gate wiring since the gate wiring 10a is formed in the form of a mesh in the present embodiment. Accordingly, it is also possible to form the gate pad at a location apart from the source pad. As a result, it is possible to design an electrode pad pattern so as to improve the degree of freedom in the electrode pad and make it easy to apply an etching to the electrode pad.

A depletion layer extending to the side of the drift region 14 is also formed from the p-type diffusion region 40 in the field limiting region 3 in the same manner as the gate wiring region. Then, a high voltage is applied to the drain pad 8, the depletion layers 50 are continuous with each other and no voltages exceeding the proof voltage are applied to the insulation films 42 and 43.

In this manner, the proof voltage of the insulation films 42 and 43 in the field limiting region 3 is secured without forming a thick insulation film in the same manner as the gate wiring region. That is, particularly, it is not necessary to form any thick insulation film, and high rated voltage can also be obtained, if only the p-type diffusion regions 40 are preliminarily formed at a space for pinching off from each other at a voltage not more than the proof voltage of the insulation films 42 and 43.

(Second Preferred Embodiment)

Now, the detailed description of a second embodiment of the invention will be specifically given with reference to FIGS. 7(a) to 7(g) and 8.

Figure 7A:
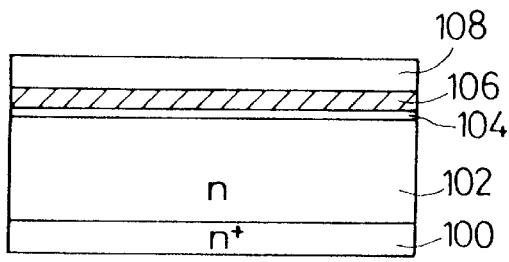
FIGS. 7(a) to 7(g) are schematic charts showing manufacturing steps of a double diffused MOS-FET as a second preferred embodiment of the invention.

FIGS. 7(a) to 7(g) show a manufacturing step of a DMOS-FET. FIG. 7(a) shows a condition that an insulation film 104, a polycrystalline silicon film 106 and an insulation film 108 are sequentially deposited on the top surface of an epitaxial substrate 102. In other words, first of all, an epitaxial growth is proceeded for a low concentration n-type drift region 102 on a high concentration n$^+$-type silicon substrate (drain region) 100 and the insulation film (oxide film) 104 is formed by a thermal oxidation method on the top surface of this drift region 102. The polycrystalline silicon film 106 containing a lot of phosphorus (P) is then deposited as a gate electrode on the top surface of this insulation film 104 by a CVD method and the insulation film (oxide film) 108 is further deposited thereon.

Figure 7B:
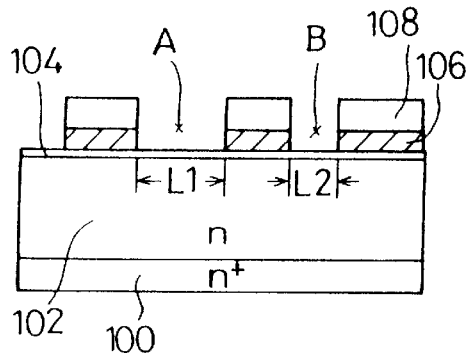

As shown in FIG. 7(b), the polycrystalline silicon film 106 and the insulation film 108 are now patterned into each predetermined shape by photolithography and an RIE method, respectively. In this pattern, an opening A corresponds to a p-type body region 114, and an opening B corresponds to a p-type diffusion region 116. An opening width L1 of the opening A is formed exceeding two times of an oxide film thickness T as an inter-layer insulation film formed in a step in FIG. 7(e), and an opening width L2 of the opening B is formed not exceeding two times of the thickness T of the oxide film 118 (see FIG. 8).

Figure 7C:
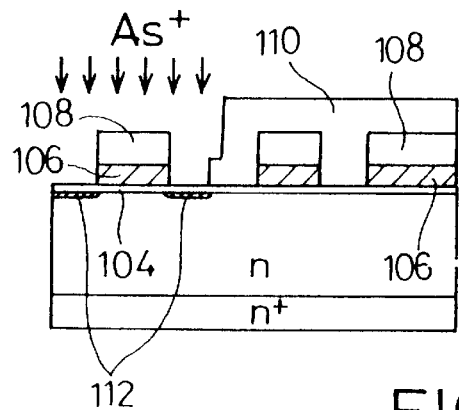

As shown in FIG. 7(c), an n$^+$-type source region 112 is formed by injecting arsenic (As) as an impurity in the perpendicular direction of the insulation film 104 by means of an ion injection method, after forming a resist film 110 in a predetermined pattern by photolithography.

Figure 7D:
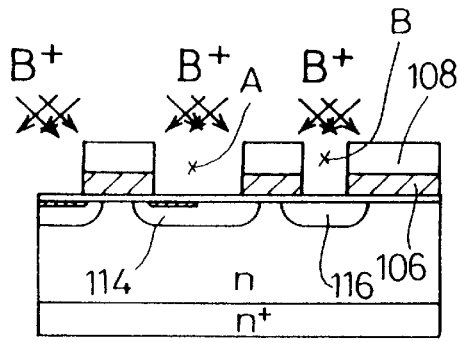

As shown in FIG. 7(d), the body region 114 and the p-type diffusion region 116 are formed, respectively, by injecting boron (B) by means of an ion injection method into the openings A and B of the pattern after removing the resist film 110. At this time, a position of the highest impurity density is set at the center of a channel formation region in the body region 114 or in the neighborhood of a junction with the drift region 102 by injecting ions in a slanting direction of the polycrystalline silicone film 106 and the insulation film 108.

Figure 7E:
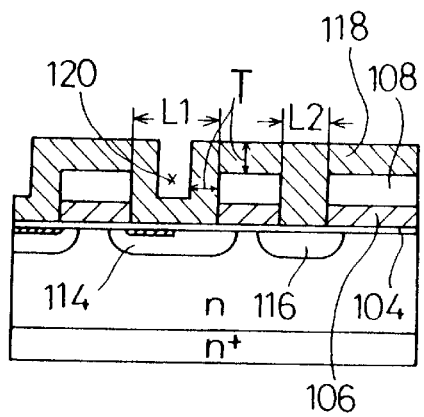

As shown in FIG. 7(e), the oxide film 118 in thickness T is deposited as an inter-layer insulation film by a CVD method. The oxide film 118 is formed substantially uniform in thickness along the top surface of a three-dimensional pattern of the polycrystalline silicon film 106 and the insulation film 108. The opening A has an opening width L1 exceeding two times of the film thickness T. When the oxide film 118 in thickness T is formed, a concavity 120 of a channel width (opening width L1—2× film thickness T) is formed. On the other hand, since the opening width L2 of the opening B is not exceeding two times of the film thickness T, the opening B is packed and a concavity is not formed on the top surface of the oxide film 118 at the opening B. Further, the oxide film 118 is deposited up to the height which is equal to that of the oxide film 118 not forming the opening B and flattened.

Figure 7F:
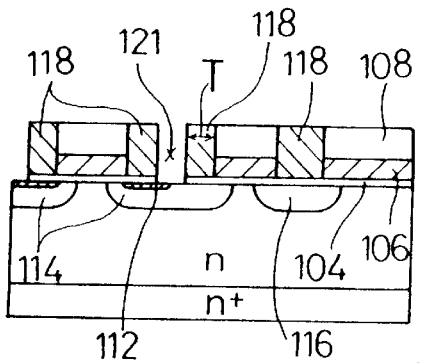

As shown in FIG. 7(f), an etching is applied to a required quantity for exposing the $n^+$-type source region 112 and the p-type body region 114 downward from the concavity 120 by an anisotropic etching. That is, an etching is applied to the total thicknesses of both the insulation film 104 and the oxide film 118. As a result, the $n^+$-type source region 112 and the p-type body region 114 are exposed in the concavity 120 and a contact hole 121 is formed. On the other hand, with regard to the members corresponding to the opening B, an oxide film 118 is left and a p-type diffusion region 116 is not exposed, because no concavity is formed on the oxide film 118 and the oxide film 118 is also flattened at the opening B.

Figure 7G:
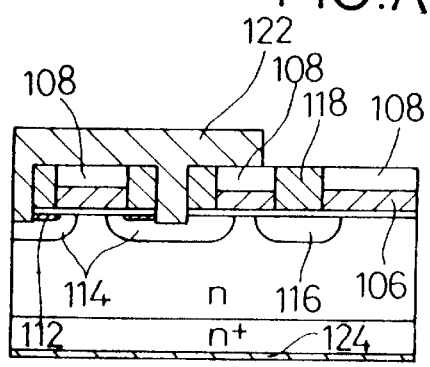
Figure 8:
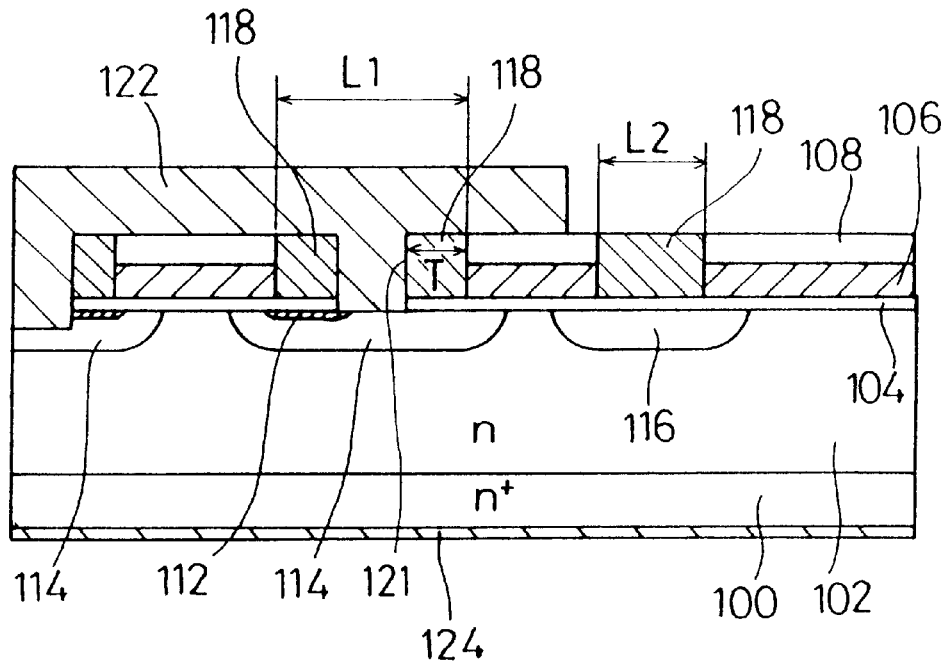
FIG. 8 is an enlarged view showing the step of FIG. 7(g)

Then, a sort of metal, such as aluminum (Al) and others, is deposited thereon by a sputtering method, resulting in forming a source wiring 122 contacting with both of the $n^+$-type source region 112 and the p-type body region 114. On the other hand, the p-type diffusion region 116 does not contact with the source wiring 122 because the p-type diffusion region 116 is not exposed. As shown in FIGS. 7(g) and 8, by means of photolithography and etching, the source wiring 122 is patterned, and the bottom surface of a silicon substrate is deposited with a metal vapor to form a drain pad 124.

According to this method, the width L2 of the opening B corresponding to the electrically floating diffusion region 116 is made not exceeding two times of the thickness T of the oxide film 118, and the width L1 of the opening A corresponding to the diffusion region (body region) 114 contacting with the source wiring 122 is made exceeding two times of the thickness T of the oxide film 118, resulting in forming an impurity introducing mask for forming the diffusion regions 114 and 116. The oxide film 118 is formed on this impurity introducing mask and the contact hole 121 is formed in the body region 114 corresponding to the opening A by applying an anisotropic etching. The oxide film 118 is left as an inter-layer insulation film, resulting in removing the photolithography process and simplifying the processes.

In the present embodiment, a high rated voltage is secured by forming the electrically floating p-type diffusion regions 116 at the outside of the element area. According to the present embodiment, there is no need to apply a thick oxide film formation process and an oxide film forming photolithography, since it is possible to form the electrically floating diffusion region in the other area than the element area simply and easily in this manner.

Furthermore, in the present embodiment, the polycrystalline silicon film 106 is formed on the p-type diffusion region 116, but it may also be good to form an insulation film thereon. That is, the impurity introducing mask for forming the p-type diffusion region is formed by overlapping the insulation films on each other into two layers. Even in the case of forming the mask in this manner, only the body region is exposed by making the opening width for the impurity introducing mask a width exceeding two times of the oxide film thickness T, also making the opening width for the p-type diffusion region a width not exceeding two times of that, and by applying an etching to the oxide film, resulting in leaving a mask due to the oxide film in the p-type diffusion region.

(Third Preferred Embodiment)

Now, the detailed description of a third embodiment of the invention will be given with reference to FIG. 9.

Figure 9:
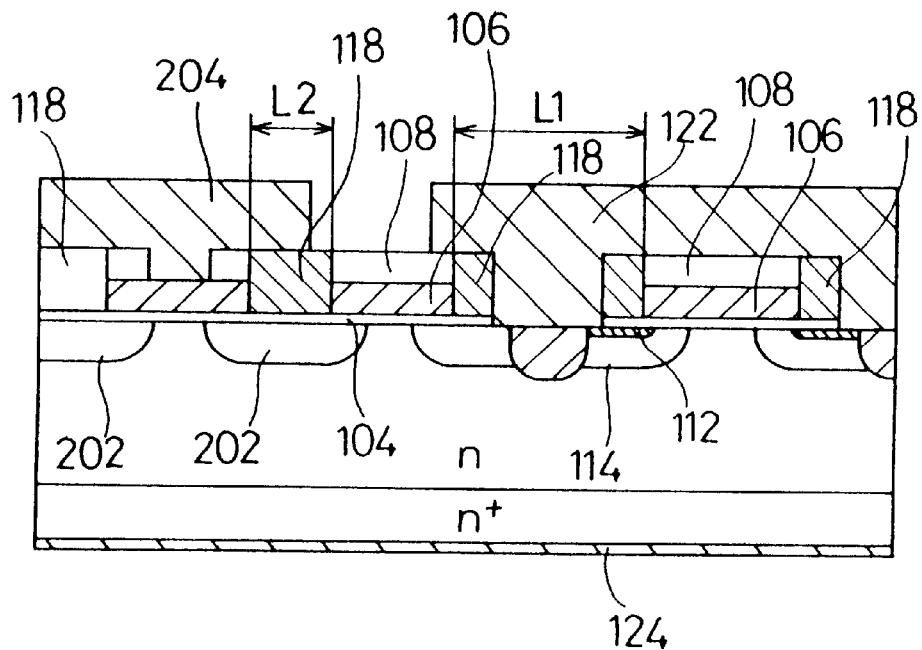
FIG. 9 is a cross-sectional view showing sectional structures of the gate and source regions in a double diffused MOS-FET as a third preferred embodiment of the invention.
Figure 10:
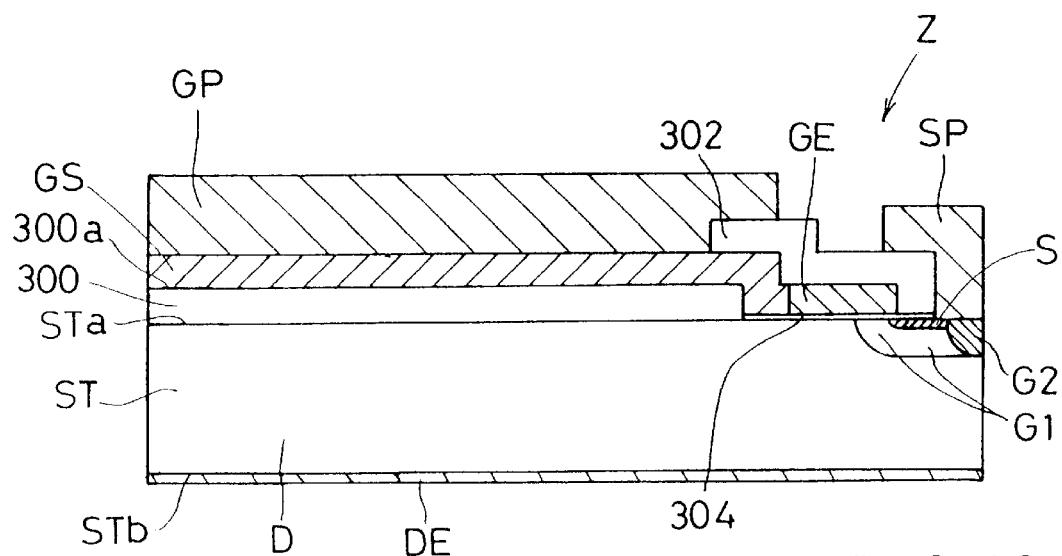
FIG. 10 is a cross-sectional view showing a sectional structure under a gate pad in a prior art double diffused MOS-FET.
Figure 11:
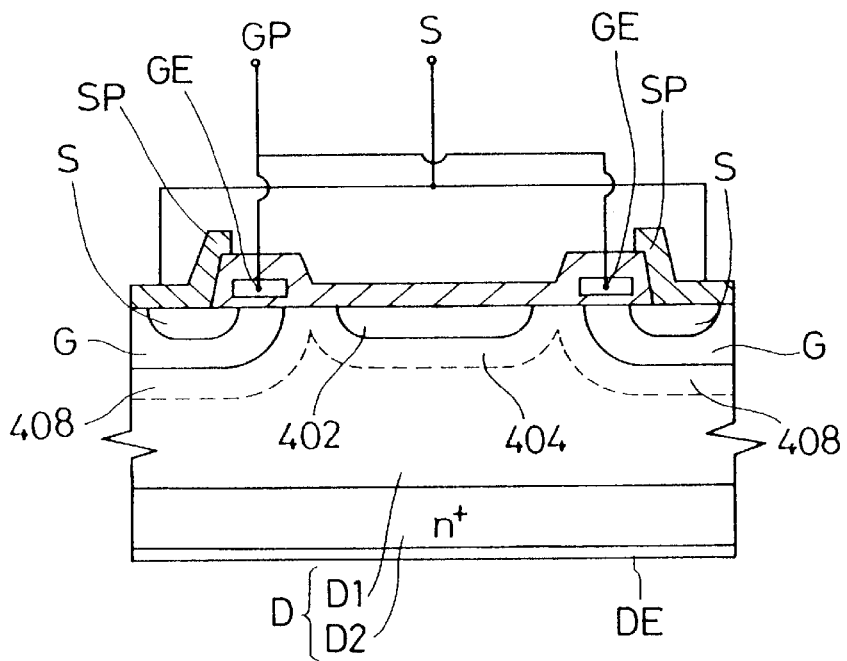
FIG. 11 is a cross-sectional view showing a prior art device for securing high rated voltage.
Figure 12:
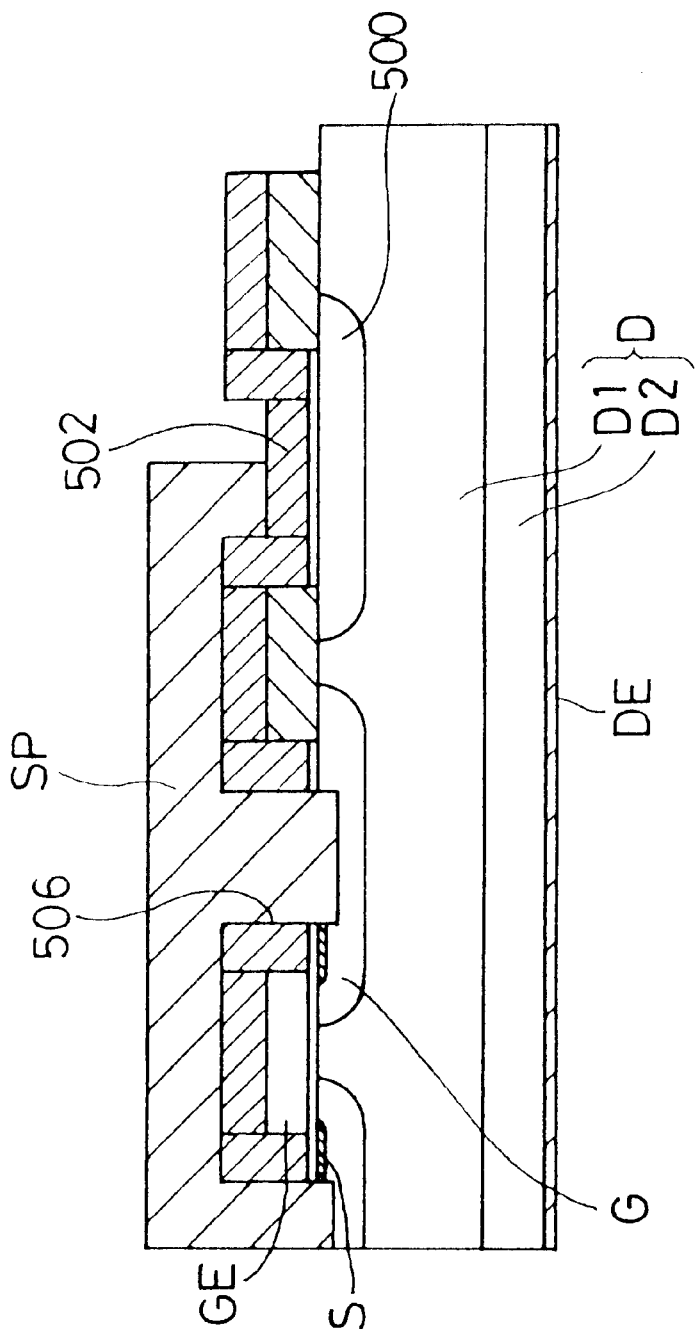
FIG. 12 is an explanatory view showing disadvantages in the case of forming an insulation film having no contact holes at an electrical floating diffusion region and having a contact hole at an electrically connected diffusion region in the prior art.
Figure 13:
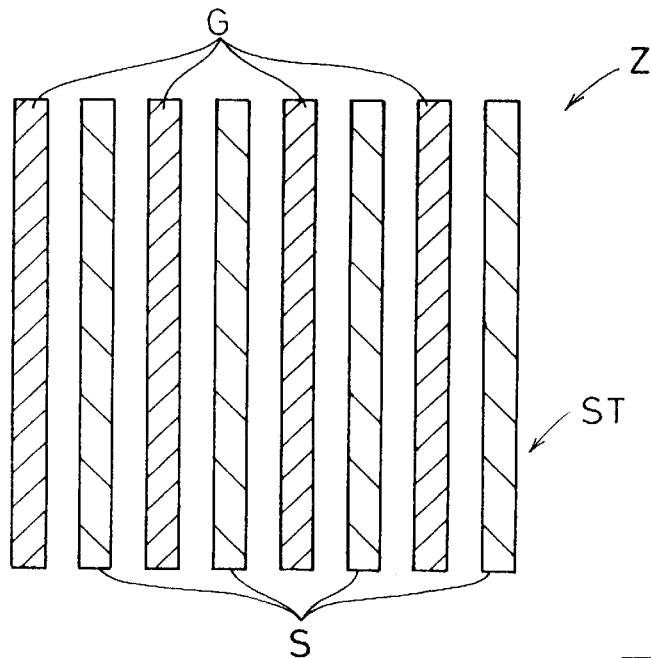
FIG. 13 is a plan view showing an example of arrangement patterns for the source region and the body region within an element area.
Figure 14:
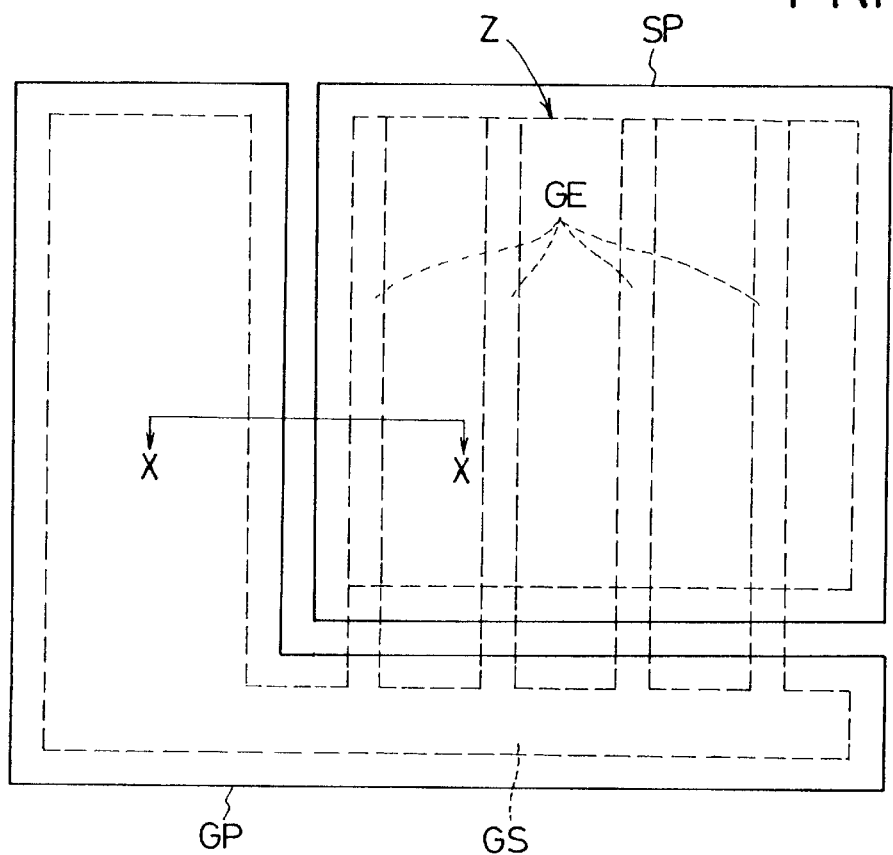
FIG. 14 is a plan view showing an example of arrangement patterns for a gate pad, a gate wiring, gate electrodes and a source pad.

FIG. 9 shows a cross section of a semiconductor device formed according to the third embodiment. Parts that are the same as those in FIG. 8 are given like reference numerals and their description will not be repeated.

The difference of this semiconductor device from that shown in FIG. 8 is the point that a p-type diffusion region 202 is not in a field limiting area thereof, but in a gate pad area. In the case of forming the electrically floating p-type diffusion region 202 under a gate pad 204, it is necessary to use an inter-layer insulation film by the oxide film 118 on this p-type diffusion region 202 at a time of forming the gate pad 204. In other words, in a relation of the opening width of the polycrystalline silicon film 106 and the insulation film 108 as an impurity introducing mask for the formation of the p-type diffusion region 202 and in a relation of the opening widths of the polycrystalline silicon film 106 and the insulation film 108 as an impurity introducing mask for the formation of the body region, with the thickness T of the oxide film 118 formed as an inter-layer insulation film in the later step even in this semiconductor device, it is possible to open selectively the contact hole 121 only in the body region 114 and form an inter-layer insulation film of the oxide film 118 in the p-type diffusion region 202 by setting these relations in the similar manner as those in the semiconductor device shown in the second preferred embodiment and applying an anisotropic etching to the oxide film 118.

As it is possible to form the electrically floating p-type diffusion region 202 simply and easily in the gate pad area in this manner, it is easily done to secure high rated voltage in this region. The high rated voltage can be secured simply and easily under the gate wiring 204 even at the point where there is no need of forming the thick field oxide film by the formation of such a p-type diffusion region 202.

Furthermore, the following construction can be summarized as a preferable mode of the present invention.

(1) A field-effect semiconductor device, which has a second conductivity type body region of the opposite conductivity type to a first conductive type intervening between the first conductivity type source region and the first conductivity type drain region, and an element region composed of gate electrodes facing this body region apart from an insulation layer, characterized in that:

the element region is electrically separably provided by forming the second conductivity type electrically floating diffusion region spaced for pinching off from each other at voltages not exceeding the proof voltage of this insulation layer at the underside of the insulation layer formed in the other region than the element region.

According to this invention, it has an effect of making it possible to secure high rated voltages without forming any thick field insulation film in the other region than the element region.

(2) A manufacturing method for the field-effect semiconductor device, which has a second conductivity type body region of the opposite conductivity type to a first conductivity type intervening between the first conductive type source region and the first conductivity type drain region and an element region composed of gate electrodes facing this body region apart from an insulation layer, and which further has a second conductivity type diffusion region distributed spacing for pinching off from each other at voltages not exceeding the proof voltage of this insulation layer at the underside of the insulation layer formed in the other region than the element region, comprising:

(a) a step of forming an impurity introducing mask having an opening for forming the body and diffusion regions;

(b) a step of forming a body region and a diffusion region by using this mask;

(c) a step of forming an inter-layer insulation film in a condition of forming the mask; and (d) a step of forming a contact hole by applying an anisotropic etching to this inter-layer insulation film;

and forming an opening for the impurity introducing mask in the step (a) described above, in width exceeding two times of the thickness of the inter-layer insulation film in the body region and in width not exceeding two times of the thickness of the inter-layer insulation film in the diffusion region.

According to this method, an inter-layer insulation film is formed to the second conductive type diffusion region distributed in the other area than the element region and formed in an electrically floating state to the electrode pad easily without adding the photolithography process thereto. Therefore, in the gate pad and the gate wiring, the thick insulation film is not formed by such distributed diffusion region, and high rated voltage is secured easily while the contact area is secured. In the field limiting region, it is easily possible to secure the field separation and high rated voltage by the distributed diffusion region without forming the thick insulation film.

According to the field-effect semiconductor devices of the present invention, as the electrically floating diffusion region is distributed spacing for pinching off from each other at voltages not exceeding the proof voltage of the insulation film in the other region than the element region, the electrodes can be formed in a continuous form thereof in such a region. Therefore, it is easily possible to secure high rated voltage in the other region than the element region by the floating diffusion region formation, while securing the contact areas among the gate electrode, the gate pad and the gate wiring with one another.

According to this manufacturing method for the semiconductor devices of the present invention, it is possible to form the contact hole in the element region and the inter-layer insulation film in the other region than the element region at the same time, in the case of forming the electrically floating diffusion region and securing high rated voltage in the other portion than the element region. Therefore, it is easily possible to form the electrically floating diffusion region in the other region than the element region without adding the photolithography process thereto.

The field-effect semiconductor device according to this invention may be a semiconductor device having a gate structure therein. For example, as a double diffused field-effect semiconductor device, it may be a conductance modulation type field-effect semiconductor device such as an UMOS, IGBT or other, and it may be n-channel or p-channel.

The shape of the island region may be a form of ring, square, cylinder, triangle or either one of them, or a combined form of any two or more thereof.

With respect to the semiconductor device and the manufacturing method thereof, the detailed description will be omitted on the following methods which are known techniques, such as a thermal oxidation method for forming oxide films, CVD (Chemical Vapor Deposition) method for forming thin films by chemical reactions, photolithography method for transferring fine patterns on masks to wafers and forming resist patterns, RIE (Reactive Ion Etching) method for removing thin films and others formed on substrates, ion injection method for introducing impurities into prescribed semiconductor regions, thermal diffusion method for introducing impurities into substrates and thin films, spattering method for forming metal thin films, i.e., one of PVD (Physical Vapor Deposition) method for physically forming thin films, and others.

While the invention has been described with reference to preferred embodiments thereof, it is to be understood that modifications or variations may be easily made without departing from the scope of the present invention which is defined by the appended claims.

What is claimed is:

1. A field-effect semiconductor device comprising:

a semiconductor substrate having a first section and a second section;

a source region at a top surface of said semiconductor substrate;

a body region at a position adjacent to said source region, said source and body regions being in said first section of said semiconductor substrate;

a drain region at a bottom surface of said semiconductor substrate;

an insulation film covering a portion of the top surface of said first and second sections of said semiconductor substrate;

a gate electrode facing said body region and said semiconductor substrate through said insulation film;

a gate pad above a top surface of said insulation film at a position covering said second section of said semiconductor substrate, said gate pad being conductive to said gate electrode;

a plurality of island regions at the top surface of said second section of said semiconductor substrate, said plurality of island regions having the opposite conductivity type to that of said semiconductor substrate, and being spaced apart from each other; and a gate wiring connecting said gate pad to said gate electrode, said gate wiring being between said gate pad and said insulation film and in the form of mesh within an area between said spaced apart plurality of island regions;

whereby rated voltage of the semiconductor device is increased by depletion regions extending from the side of each of said island regions within the semiconductor substrate.

2. A field-effect semiconductor device as defined in claim 1, wherein said plurality of island regions are distributed and spaced apart from each other so that the depletion regions extending from the side of each of the island regions are continuous with each other when a voltage is applied to the drain region.

3. A field-effect semiconductor device as defined in claim 1 wherein the gate pad covers substantially all of the second section of the semiconductor substrate.

4. A field-effect semiconductor device comprising:

a semiconductor substrate of a first type of semiconductor material having a first concentration and having a top surface and a bottom surface, the top surface including at least first and second sections;

a body region of a second type of semiconductor material having a second concentration and being within the first section of the semiconductor substrate, a portion of the body region abutting the top surface of the semiconductor substrate;

a source region, of the first type of semiconductor material, having a third concentration higher than the first concentration, the source region being within the body region, a portion of the source region abutting the top surface of the semiconductor substrate;

a drain region, of the first type of semiconductor material, having a fourth concentration higher than the first concentration, formed within the semiconductor substrate, a portion of the drain region abutting the bottom surface of the semiconductor substrate;

a plurality of island regions distributed throughout the second section of the semiconductor substrate, the island regions being of the second type of semiconductor material and having a fifth concentration;

a first insulator film on portions of the top surface of the first and second sections of the semiconductor substrate;

a gate electrode on a top surface of the first insulator film, the gate electrode being above the first and second sections of the semiconductor substrate; and a gate pad on the gate electrode above the second section of the semiconductor substrate, the gate pad being electrically connected to the gate electrodes;

wherein the gate pad covers substantially all of the second section of the semiconductor substrate.

5. A field-effect semiconductor device as in claim 4 further comprising:

a second insulator film on a top and side surfaces of the gate electrode above the first section of the semiconductor substrate; and a source pad on the source region, body region and second insulator film above the first section of the semiconductor substrate, the source pad being electrically connected to the source region and the body region.

6. A field-effect semiconductor device as in claim 5 wherein the source pad covers substantially all of the first section of the semiconductor substrate.

7. A field-effect semiconductor device as in claim 5 wherein the source pad and gate pad include aluminum and each pad is capable of having a wire bonded thereto.

8. A field-effect semiconductor device as in claim 4 wherein the gate electrode within the second section of the semiconductor material has a mesh structure.

9. A field-effect semiconductor device as in claim 8 wherein the plurality of island regions are distributed in a grid pattern.

10. A field-effect semiconductor device as in claim 9 wherein the gate electrode covers the semiconductor substrate between the plurality of island regions.

11. A field-effect semiconductor device as in claim 10 wherein the gate electrode disposed in the first section of the semiconductor substrate has a linear array structure.

12. A current controlling device comprising:

a first semiconductor region, having a second conductivity type, within a first area of the semiconductor substrate and contacting a first surface of the semiconductor substrate;

a second semiconductor region, having the first conductivity type, within the first semiconductor region and contacting the first surface of the semiconductor substrate;

a third semiconductor region, having the first conductivity type, within the semiconductor substrate and contacting a second surface of the semiconductor substrate;

a plurality of fourth semiconductor regions, having the second conductivity type, within a second area of the semiconductor substrate;

a first electrode separated from the first surface of the semiconductor substrate by a first non-conductive layer, the first electrode extending over the first and second areas of the semiconductor substrate;

a second electrode extending over the second area of the semiconductor substrate and connected to the first electrode; and a wiring connecting said second electrode to said first electrode, said wiring being between said second electrode and said first non-conductive layer and in the form of mesh within an area between said fourth semiconductor regions.

13. A current controlling device as in claim 12 further comprising a third electrode separated from the first electrode by a second non-conductive layer and extending over the first area, the third electrode being connected to the first and second semiconductor regions.

14. A current controlling device as in claim 13 wherein the second and third electrodes are bonding pads.

15. A current controlling device as in claim 12 wherein the first electrode forms a mesh pattern in the second area.

16. A current controlling device as in claim 15 wherein the fourth semiconductor regions are distributed at regular intervals.

17. A current controlling device as in claim 16 wherein the first electrode avoids upright portions of the distributed fourth semiconductor regions.

18. A current controlling device as in claim 17 wherein the first electrode in the first area of the semiconductor substrate has a linear array structure.

19. A field-effect semiconductor device as in claim 12 wherein the second electrode covers substantially all of the second area of the semiconductor substrate.

* * * * *